United States Patent

Higashi et al.

[15] 3,638,143

[45] Jan. 25, 1972

[54] FREQUENCY-MODULATING SYSTEM FOR MICROWAVE SOLID-STATE OSCILLATOR

[72] Inventors: Tadao Higashi; Yoshinori Iwata; Masae Ohta, all of Tokyo-to, Japan

[73] Assignee: Oki Electric Industry Company Limited, Tokyo, Japan

[22] Filed: Sept. 2, 1969

[21] Appl. No.: 854,642

[30] Foreign Application Priority Data

Sept. 3, 1968 Japan....................................43/62774

[52] U.S. Cl............................332/30 V, 307/320, 331/36 C, 331/107, 331/107 G, 331/107 T, 332/52

[51] Int. Cl...........................................................H03c 3/22

[58] Field of Search.....................332/30, 30 V, 52; 307/320; 334/15; 331/107, 107 S, 107 G, 107 T, 36 C, 177 V

[56] References Cited

UNITED STATES PATENTS 3,141,141 7/1964 Sharpless............................331/107 T
3,465,265 9/1969 Kuru....................................332/30 V

FOREIGN PATENTS OR APPLICATIONS 1,186,519 2/1965 Germany............................331/107 T

OTHER PUBLICATIONS

Lee et al. " Frequency Modulation of a Millimeter-Wave IMPATT Diode Oscillator and Related Harmonic Generation Effects" The Bell System Technical Journal Jan. 1969 pp. 143–161

16Hz" et al. " Microwave Gunn Oscillator Tuned Electronically Over 1GHz June 14, 1968 Electronics Letters Vol. 4, No. 12, pp. 240–242

*Primary Examiner*—Alfred L. Brody
*Attorney*—McGlew and Toren

[57] ABSTRACT

Frequency modulation is obtained by applying a modulating voltage across a variable capacitance diode which appears in the center conductor of a cavity resonator. A direct voltage energizes a Gunn diode coupled with the resonator. Thus frequency modulation characteristics can be set irrespective of the modulation voltage and current directly influencing the oscillation output.

8 Claims, 4 Drawing Figures

Figures 1, 2, 3, 4:
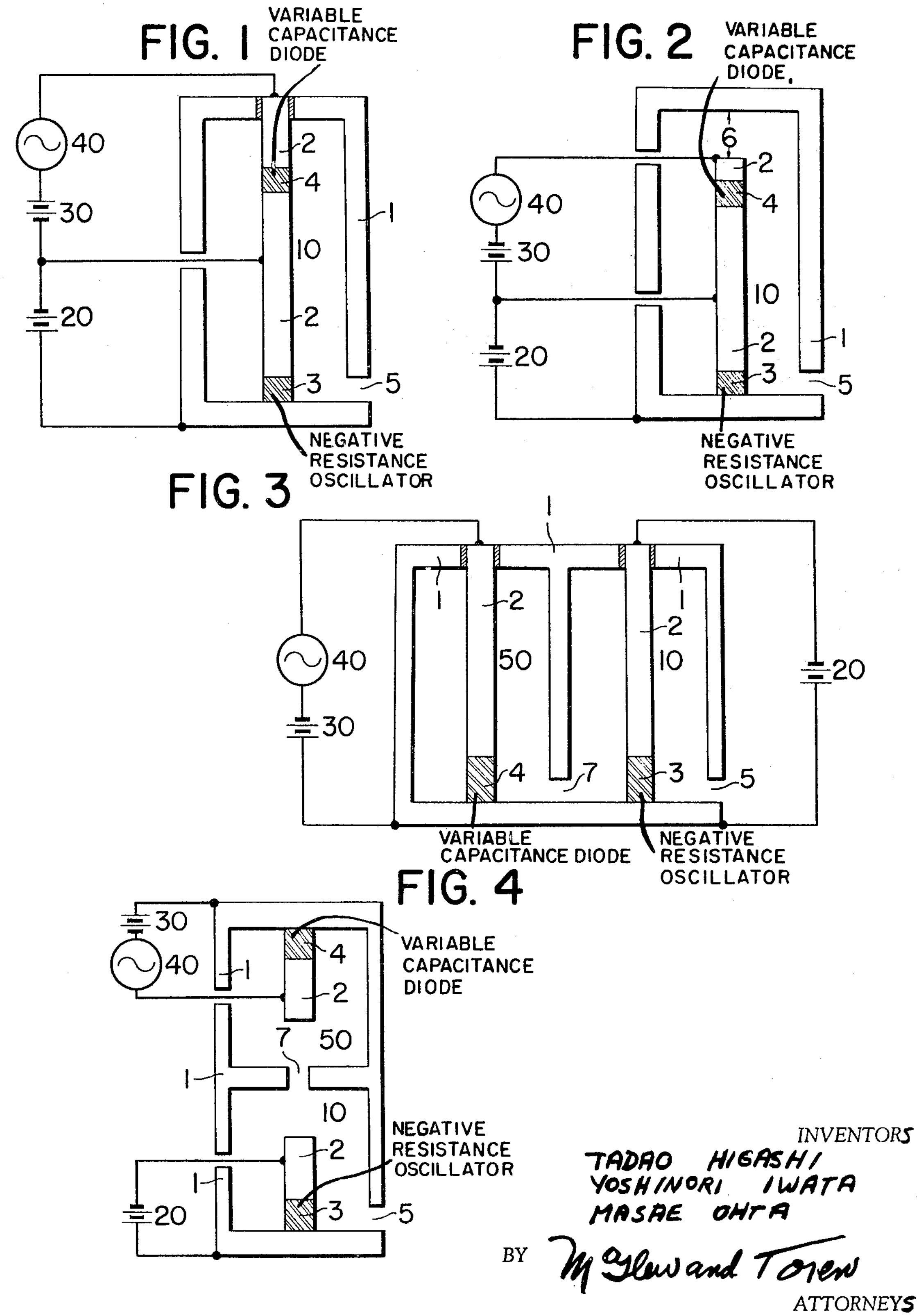

INVENTORS
TADAO HIGASHI
YOSHINORI IWATA
MASAE OHTA
BY McGlew and Toren
ATTORNEYS

FREQUENCY-MODULATING SYSTEM FOR MICROWAVE SOLID-STATE OSCILLATOR

This invention relates to a frequency modulating method for a microwave solid oscillator in which is used such negative resistance type oscillating device (which shall be referred to merely as an oscillating device hereinafter) as, for example, an avalanche diode or Gunn diode.

Such oscillating device as a Gunn diode has a property that, when its impressed current and voltage are directly varied, the oscillation frequency will vary and therefore some frequency modulation is possible.

However, it has also a property undesirable to a frequency modulator that the output of the oscillator is also proportional to the impressed current and voltage and, the larger the desired oscillation output, the narrower the frequency variation range for a fixed impressed current and voltage variation range.

Therefore, the present invention has it as an object to provide a frequency modulating system wherein such requirement in the frequency modulating system as the setting of the center frequency and the setting of the output can be made substantially independently of each other.

That is to say, the present invention has been attained by providing an oscillating device within a coaxial cavity resonator or a semicoaxial cavity resonator (each of which shall be referred to as a coaxial type cavity resonator hereinafter) so that the resonance frequency of said coaxial-type cavity resonator may be directly or secondarily varied by a variable capacitance diode controlled by a modulation signal.

In the accompanying drawings:

FIGS. 1 to 4 are sectional views showing respective embodiments of a frequency modulating apparatus for carrying out the method according to the present invention.

In FIG. 1, 1 and 2 are respectively a coaxial wall and center conductor of a coaxial cavity resonator. 3 and 4 connected in series with said center conductor 2 are respectively an oscillating element and variable capacitance diode. 5 is an output window. 20 and 30 are direct current sources respectively for setting the oscillating element 3 and variable-capacitance diode 4 in the operating condition. 40 is a modulation signal source.

The illustrated coaxial cavity resonator 10 can be considered to be an ordinary coaxial cavity resonator having a gap corresponding to the capacitance of the variable capacitance diode 4. Said oscillating element 3 oscillates at the resonance frequency of this coaxial cavity resonator.

In such case, in the circuit of the center conductor 2—oscillating device 3—direct current source 30—modulation signal source 40, the capacitance of said variable capacitance diode 4 will be modulated by the modulation signal source 40 and therefore the oscillation frequency will be also modulated and will be taken out of the output window 5. In such formation, irrespective of the impressed voltage and current fed to the oscillating device 3, that is to say, primarily irrespective of the oscillation output, the central frequency and other modulation characteristics can be freely selected, for example, by the geometrical shape and size of the cavity resonator 10 or the setting of a gap 6 as shown in FIG. 2 between the center conductor 2 and the coaxial wall 1 and therefore it is possible to obtain a wide modulation range.

In the above-mentioned embodiment, the resonance frequency of the coaxial-type cavity resonator containing the oscillating device 3 is directly varied. But, as shown in FIG. 3 or 4, for example, another coaxial-type cavity resonator 50 is provided as connected through a connecting window 7 so that the resonance frequency of said resonator 50 may be made variable by the variable-capacitance diode 4 and may be led to the resonator 10 by the electromagnetic combination by the connecting window 7 to modulate the oscillation frequency. According to this formation, such favorable action as the reduction of the FM noise in the oscillated waves accompanies the frequency modulation.

Though it is difficult to theoretically definitely explain it, the following explanation will serve to understand it. That is to say, it may be considered that oscillated waves containing various frequencies and generated by the resonator 10 drive the resonator 50 through the connecting window 7, the waves of some specific frequencies are reflected to the resonator 10 through the connecting window 7 by the sufficient filtering action of the resonator 50 having had Q set higher than in the resonator 10, thereby the oscillated waves in the resonator 10 are synchronized just as in an injection synchronizing phenomenon and the FM noise is reduced.

Thus, so long as in an oscillation range in the resonator 10, the oscillation frequency will be primarily determined by the resonator 50. Therefore, the Q of the resonator 50 should be selected to be high but will be naturally limited by the amount of connection of the connecting window or Q and therefore the frequency variable range of the resonator 50.

However, such limitation can be simply solved by connecting both resonators 10 and 50 with each other through a transmitting line instead of the connecting window 7 so that, for example, the Q of the resonator 10 may be made considerably low but the Q of the resonator 50 may be made high.

As evident from the above explanation, according to the present invention, there is developed such excellent effect that the frequency modulating characteristics can be set independently of the impressed voltage and current directly influencing the oscillation output.

What is claimed is:

1. A frequency modulation system comprising, resonator means having a center conductor and an outer conductor, control means for energizing said resonator means into resonant oscillations, variable capacitance means forming a portion of said center conductor, modulating voltage means connected across said capacitance means for changing the capacitance of said capacitance means in accordance with a modulating frequency, and source means for maintaining said outer conductor at a potential different from said center conductor at said capacitance means.

2. A frequency modulation system comprising, resonator means having a center conductor and an outer conductor, control means for energizing said resonator means into resonant oscillations, variable capacitance means forming a portion of said center conductor, and modulating voltage means connected across said capacitance means for changing the capacitance of said capacitance means in accordance with a modulating frequency, said control means including oscillator means capable of independently sustaining oscillations at one frequency and coupled to said resonator means for exciting said resonator means.

3. A frequency-modulating system as claimed in claim 2, wherein said resonator means and said oscillator means both include cavity resonator means electromagnetically coupled to each other.

4. A frequency modulation system as claimed in claim 3, wherein said cavity resonators are located side by side and said center conductors are axially spaced from each other and parallel to each other.

5. A frequency modulation system as claimed in claim 3, wherein said cavity resonators are arranged end to end and said center conductors are coaxial.

6. A frequency modulation system as claimed in claim 3, wherein a transmission line connects said resonators to each other.

7. A frequency modulation system as claimed in claim 6, wherein said resonator means has a Q higher than that of said oscillator means.

8. A frequency-modulating system as claimed in claim 2, wherein said oscillator means form a portion of the center conductor.

* * * * *